(12) United States Patent
Amadi

(10) Patent No.: US 9,191,001 B2
(45) Date of Patent: Nov. 17, 2015

(54) TRANSISTOR DEVICES OPERATING WITH SWITCHING VOLTAGES HIGHER THAN A NOMINAL VOLTAGE OF THE TRANSISTOR

(71) Applicant: Cirrus Logic, Inc., Austin, TX (US)

(72) Inventor: Christophe Jean-Francois Amadi, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/137,073

(22) Filed: Dec. 20, 2013

(65) Prior Publication Data

US 2015/0180473 A1    Jun. 25, 2015

(51) Int. Cl.
*H03K 19/003* (2006.01)
*H03K 5/003* (2006.01)
*H03K 19/20* (2006.01)
*H03K 19/0185* (2006.01)

(52) U.S. Cl.
CPC .......... *H03K 19/00315* (2013.01); *H03K 5/003* (2013.01); *H03K 19/018507* (2013.01); *H03K 19/20* (2013.01)

(58) Field of Classification Search
None
See application file for complete search history.

(56) References Cited

U.S. PATENT DOCUMENTS

| 5,406,141 | A | 4/1995 | Yero et al. |
| 5,969,542 | A | 10/1999 | Maley et al. |
| 6,407,579 | B1 | 6/2002 | Goswick |
| 6,566,930 | B1 | 5/2003 | Sato |
| 7,804,350 | B1 | 9/2010 | Edmondson et al. |
| 2007/0171696 | A1* | 7/2007 | Dray et al. ..................... 365/145 |

* cited by examiner

*Primary Examiner* — Jany Richardson
(74) *Attorney, Agent, or Firm* — Norton Rose Fulbright US LLP

(57) ABSTRACT

A voltage selector circuit may be coupled to transistors to protect one or more inputs of the transistor from exceeding a safe operating range. In one example, a cross-coupled pair of transistors may be coupled to a gate of a transistor to select between a first voltage and a cascoded voltage that is a safe bias voltage. Thus, the transistor may be protected from unsafe gate-to-source voltages. The voltage selector may be used to build circuits, such as invertors, level shifter, NAND gates, and NOR gates, that function with power supply voltages that may exceed the safe operating range of the transistors.

21 Claims, 9 Drawing Sheets

TRANSISTOR DEVICES OPERATING WITH SWITCHING VOLTAGES HIGHER THAN A NOMINAL VOLTAGE OF THE TRANSISTOR

FIELD OF THE DISCLOSURE

The instant disclosure relates to integrated circuits. In particular, the instant disclosure relates to protecting transistors in the integrated circuits from voltages over an acceptable range.

BACKGROUND

As transistors shrink in size to allow higher density and lower power devices, the maximum voltage that transistors can withstand without damage also decrease. These transistors make up integrated circuits (ICs) and devices that are powered by low-voltage direct current (DC) power sources. For example, mobile devices containing these transistors may be powered by a rechargeable battery. Transistor technology often moves from one generation to the next at a faster rate than battery technology. Thus, there may be a mismatch between the maximum voltage that the transistor can withstand and the power source can provide. For example, a battery may output a voltage between 3.6 Volts and over 5 Volts, depending on the charge level of the battery. However, transistors may have a lower maximum voltage than the battery output. For example, a 5 Volt laterally-diffused metal-oxide-semiconductor (5V LDMOS) transistor may have safe operating areas of −3.6 Volts to +3.6 Volts for the gate-to-source voltage, −3.6 Volts to +5.5 Volts for the gate-to-drain voltage, −3.6 Volts to +3.6 Volts for the gate-to-base voltage, −0.6 Volts to +3.6 Volts for the base-to-source voltages, and −5.5 Volts to +0.6 Volts for the drain-to-base voltage. Some of these safe operating ranges are smaller than the maximum possible output voltage of the battery.

If the transistor receives a larger voltage than the maximum acceptable voltage for one of the operating areas, then the transistor may be irreparably damaged and cause the device containing the transistor to stop working. In particular, in the example described above, n-channel metal-oxide-semiconductor (NMOS) transistors with their source connected to ground cannot have their gate voltage pulled to the positive supply voltage provided by the power source. Additionally, in the example described above, p-channel metal-oxide-semiconductor (PMOS) transistors with their source connected to the positive supply voltage cannot have its gate pulled down to ground. Thus, for example, when the power supply voltage is between 3.6 Volts and 5.0 Volts, these metal-oxide-semiconductor transistors are unable to have their gates swing from positive to negative supply voltages, which most complementary metal-oxide-semiconductor (CMOS) circuits are designed for. In this situation, certain conventional commonly-used CMOS circuits, which include both PMOS and NMOS transistors, are unavailable for use in design of the device.

FIG. 1 is a circuit illustrating a prior art inverter. An inverter 100 includes a p-channel metal-oxide-semiconductor (PMOS) transistor 112 and an n-channel metal-oxide-semiconductor (NMOS) transistor 114 coupled together. The PMOS transistor 112 is also coupled to a positive supply voltage, $V_{dd}$, and the NMOS transistor 114 is also coupled to a negative supply voltage, $V_{ss}$. An input provided to the inverter 100 at input node 102 is inverted at an output node 104. For example, an input '1' value to the input node 102 will produce an output '0' value at the output node 104.

FIG. 2 is a circuit illustrating a prior art level shifter. A level shifter 200 includes cross-coupled PMOS transistors 232 and 234 and NMOS transistors 212 and 214. The PMOS transistors 232 and 234 are also coupled to the positive supply voltage, $V_{dd}$, and the NMOS transistors 212 and 214 are also coupled to the negative supply voltage, $V_{ss}$. An input to the level shifter 200 at input node 102A is inverted at input node 102B to provide a differential input to the level shifter 200. An output at the output nodes 104A and 104B is level shifted from the input provided at the input node 102A.

In each of the circuits of FIG. 1 and FIG. 2, the PMOS transistors 112, 232, and 234 have their source connected to the positive supply voltage, $V_{dd}$, and thus cannot have their gates pulled down to ground. Likewise, the NMOS transistors 114, 212, and 214 have their source connected to the negative supply voltage, $V_{ss}$, and thus cannot have their gate voltage pulled up to the positive supply voltage.

In prior solutions, a level shifter was coupled to the gate of a transistor and the level shifter selected between a supply voltage and a cascoded voltage to limit operation of the transistor outside of safe operating areas. However, when the threshold voltage of the transistor increases, due to manufacturing variation or design, or when the battery is discharged and the supply voltage is low, the circuit's performance degrades. In particular, the level shifter operates in sub-threshold conduction, creating large output impedance. The level shifter then loses drive strength and becomes susceptible to noise, and the transition time is increased. As the power supply voltage drops in these circumstances, control of the level shifters is lost and it becomes impossible to safely turn off circuit blocks with power switches.

Shortcomings mentioned here are only representative and are included simply to highlight that a need exists for improved transistor-based devices, particularly for consumer-level devices. Embodiments described here address certain shortcomings but not necessarily each and every one described here or known in the art.

SUMMARY

Transistors with safe operating areas smaller than an available power supply voltage may be used with the power supply voltage by generating a bias (or cascode) voltage, having a lower absolute voltage value than the power supply voltage, available and coupling an input selector to the transistors. The input voltage selector selects between the power supply voltage and the cascode or bias voltage depending on which voltage is within the acceptable range for the transistor. The voltage selector may be used with p-channel metal-oxide-semiconductor (PMOS) transistors and n-channel metal-oxide-semiconductor (NMOS) transistors in integrated circuits (ICs) and devices to allow operation of the transistors with power supplies that exceed the acceptable input range of the transistors.

In one embodiment, an apparatus may include a first input node coupled to a first voltage, a second input node coupled to a second voltage, and an output node coupled to a transistor. The apparatus may also include a cross-coupled pair of transistors coupled to the first input node and the second input node and coupled to the output node, wherein the cross-coupled pair of transistors is configured to receive the first voltage and the second voltage and to output a gate voltage to the output node, and wherein the gate voltage is bounded to an acceptable voltage level for the transistor allowing at least one of the first voltage and the second voltage to swing with an amplitude greater than the acceptable voltage level for the transistor.

In certain embodiments, the apparatus may also include a transistor having a gate coupled to the gate output node, wherein the bounded voltage level is less than a maximum gate-to-source voltage of the transistor; a power supply coupled to the first input node to provide the supply voltage, wherein the power supply voltage is higher than the maximum gate-to-source voltage of the transistor; a cross-coupled pair of PMOS transistors, and wherein the transistor comprises a first PMOS transistor; an NMOS transistor comprising a gate and a drain, wherein the drain is coupled to a drain of the PMOS transistor; and/or a cross-coupled pair of NMOS transistors configured to act as a minimum voltage selector, wherein the cross-coupled pair of NMOS transistors is configured to receive a first input voltage and a second input voltage and output a second gate voltage to a second output node coupled to the gate of the NMOS transistor, and wherein the cross-coupled pair of NMOS transistors is configured to act as a minimum voltage selector between a second cascoded voltage and a full swing input such that a maximum gate-to-source voltage of the NMOS transistor is approximately the second cascoded voltage when the input is high and low otherwise.

In one embodiment, the apparatus may be a logic gate such as a NOR gate or an AND gate. When the logic gate is a NOR gate, the apparatus may include a second PMOS transistor comprising a second PMOS gate and a second PMOS source, wherein the second PMOS source is coupled to a first PMOS drain of the PMOS transistor; a second pair of cross-coupled PMOS transistors, wherein the second cross-coupled pair of PMOS transistors is configured to receive the first voltage and the second voltage and output a second PMOS gate voltage to the second PMOS gate; a first NMOS transistor comprising a first NMOS gate and a first NMOS drain, wherein the first NMOS drain is coupled to a second PMOS drain of the second PMOS transistor; a first pair of cross-coupled NMOS transistors, wherein the first cross-coupled pair of NMOS transistors is configured to receive a third voltage and a fourth voltage and to output a first NMOS gate voltage to the first NMOS gate of the first NMOS transistor; a second NMOS transistor comprising a second NMOS gate and a second NMOS drain, wherein the second NMOS drain is coupled to the first NMOS drain; and/or a second pair of cross-coupled NMOS transistors, wherein the second cross-coupled pair of NMOS transistors is configured to receive the third voltage and the fourth voltage and to output a second NMOS gate voltage to the second NMOS gate of the second NMOS transistor. When the apparatus is a NAND gate, the apparatus may include a second PMOS transistor comprising a second PMOS gate and a second PMOS drain, wherein the second PMOS drain is coupled to a first PMOS drain of the PMOS transistor; a second pair of cross-coupled PMOS transistors, wherein the second cross-coupled pair of PMOS transistors is configured to receive the first voltage and the second voltage and output a second PMOS gate voltage to the second PMOS gate; a first NMOS transistor comprising a first NMOS gate and a first NMOS drain, wherein the first NMOS drain is coupled to a second PMOS drain of the second PMOS transistor; a first pair of cross-coupled NMOS transistors, wherein the first cross-coupled pair of NMOS transistors is configured to receive a third voltage and a fourth voltage and to output a first NMOS gate voltage to the first NMOS gate of the first NMOS transistor; a second NMOS transistor comprising a second NMOS gate and a second NMOS drain, wherein the second NMOS drain is coupled to a first NMOS source of the first NMOS transistor; and/or a second pair of cross-coupled NMOS transistors, wherein the second cross-coupled pair of NMOS transistors is configured to receive the third voltage and the fourth voltage and to output a second NMOS gate voltage to the second NMOS gate of the second NMOS transistor.

In another embodiment, a method may include receiving a first voltage and a second voltage; and/or generating an output voltage, with a cross-coupled pair of transistors, from the first voltage and the second voltage for a transistor having an acceptable voltage input range smaller than at least one of the first voltage and the second voltage, wherein the output voltage is bounded by an acceptable voltage range for a transistor receiving the output voltage allowing at least one of the first voltage and the second voltage to swing with an amplitude greater than the acceptable voltage level for the transistor.

In certain embodiments, the acceptable voltage range for the transistor is bounded by a maximum gate-to-source voltage for the transistor; a reference voltage for the acceptable voltage range is ground for NMOS devices and a reference voltage for the acceptable voltage range is a power supply voltage for PMOS devices; the step of generating the output voltage may include generating an output voltage for a PMOS transistor, wherein the cross-coupled pair of transistors are configured to act as a maximum voltage selector between a cascoded voltage and at least one of a full swing output when the PMOS transistor is part of a level shifter and a full swing input when the PMOS transistor is part of an inverter or a logic gate, such that a maximum gate-to-source voltage of the PMOS transistor is approximately a supply voltage minus the cascoded voltage; and/or the step of generating the output voltage may include generating an output voltage for an NMOS transistor, wherein the cross-coupled pair of transistors are configured to act as a minimum voltage selector between a second cascoded voltage and at least one of a full swing output when the NMOS transistor is part of a level shifter and a full swing input when the PMOS transistor is part of an inverter or a logic gate, such that a maximum gate-to-source voltage of the NMOS transistor is approximately the second cascoded voltage.

In a further embodiment, an inverter may include a PMOS transistor having a gate, a drain, and a source, wherein the source is coupled to a first supply voltage; an NMOS transistor comprising a gate, a drain, and a source, wherein the drain is coupled to the drain of the PMOS transistor, and wherein the source is coupled to a second supply voltage; a first level shifter coupled to the gate of the PMOS transistor, the first level shifter comprising a pair of cross-coupled PMOS transistors configured to select a maximum voltage between a cascoded voltage and a full swing input such that a maximum gate-to-source voltage of the PMOS transistor is approximately the supply voltage minus the cascoded voltage; and/or a second level shifter coupled to the gate of the NMOS transistor, the second level shifter comprising a pair of cross-coupled NMOS transistors configured to select a minimum between a second cascoded voltage and the full swing input such that a maximum gate-to-source voltage of the NMOS transistor is approximately the second cascoded voltage.

In certain embodiments, the first cascoded voltage may be approximately less than one half of the first supply voltage; the second cascoded voltage may be approximately more than one half of the first supply voltage; the first cascoded voltage may be approximately three tenths of the first supply voltage; the second cascoded voltage may be approximately seven tenths of the first supply voltage; the first supply voltage may be a battery voltage of a mobile device; and/or the inverter may be configured to operate across a range of battery voltages.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
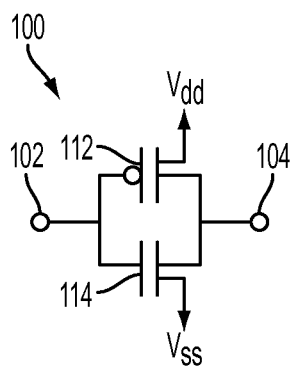
FIG. 1 is a circuit illustrating a prior art inverter.
Figure 2:
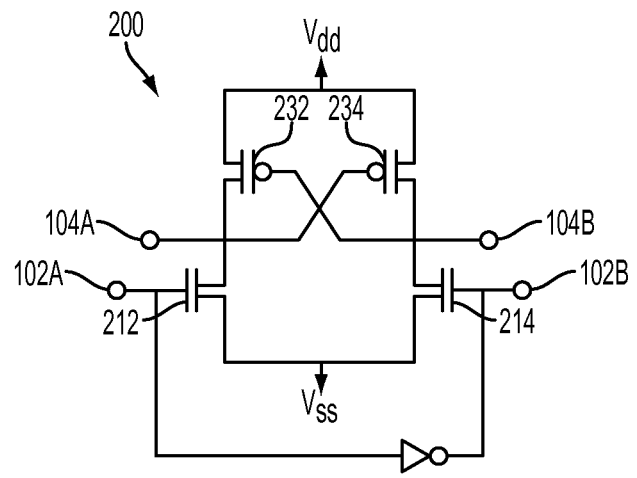
FIG. 2 is a circuit illustrating a prior art level shifter.
Figure 3A:
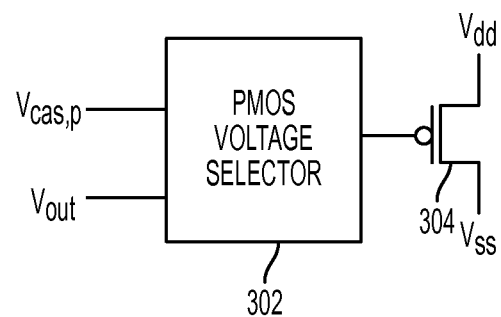
FIG. 3A is a block diagram illustrating a voltage selector for a p-channel metal-oxide-semiconductor (PMOS) transistor according to one embodiment of the disclosure.

FIG. 3A is a block diagram illustrating a voltage selector for a p-channel metal-oxide-semiconductor (PMOS) transistor according to one embodiment of the disclosure. A PMOS voltage selector 302 may be coupled to a gate of a PMOS transistor 304. The voltage selector 302 may select between a cascoded voltage, $V_{cas,p}$, and an output voltage, $V_{out}$. For example, the voltage selector 302 may select a maximum voltage between the $V_{cas,p}$ and $V_{out}$ voltages. The cascoded voltage, $V_{cas,p}$, may be, for example, above 50%, or 70% of the positive supply voltage $V_{dd}$. Although the cascoded voltage and the output voltage are provided as examples, the voltage selector 302 may receive any two or more voltages and select an appropriate voltage, such as a maximum voltage, from the received voltages. Additionally, although the voltage selector 302 is shown coupled to a gate of the transistor 304, the voltage selector 302 may also be coupled to the drain or source. The selected voltage by the voltage selector 302 may be input to the PMOS transistor 304 to maintain the operating areas of the transistor 304 within safe operating areas. For example, the voltage applied to the gate of the transistor 304 may be within an acceptable range for the gate-to-source voltage of the transistor 304.

Figure 3B:
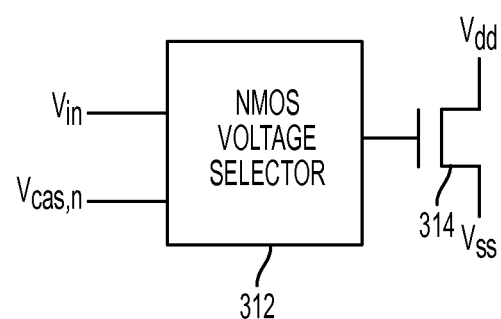
FIG. 3B is a block diagram illustrating a voltage selector for an n-channel metal-oxide-semiconductor (NMOS) transistor according to one embodiment of the disclosure.

A similar voltage selector to that described with reference to FIG. 3A may be coupled to n-channel metal-oxide-semiconductor (NMOS) transistors. FIG. 3B is a block diagram illustrating a voltage selector for an n-channel metal-oxide-semiconductor (NMOS) transistor according to one embodiment of the disclosure. An NMOS voltage selector 312 may be coupled to a gate of an NMOS transistor 314. The voltage selector 312 may select between a cascoded voltage, $V_{cas,n}$, and an input voltage, $V_{in}$. For example, the voltage selector 312 may select a minimum voltage between the $V_{cas,n}$ and $V_{in}$, voltages. Although the cascoded voltage and the input voltage are provided as examples, the voltage selector 312 may receive any two or more voltages and select an appropriate voltage, such as a minimum voltage, from the received voltages. The cascoded voltage, $V_{cas,n}$, may be, for example, above 50% or 70% of the negative supply voltage, $V_{ss}$. Additionally, although the voltage selector 312 is shown coupled to a gate of the transistor 314, the voltage selector 312 may also be coupled to the drain or source. The selected voltage by the voltage selector 312 may be input to the NMOS transistor 314 to maintain the operating areas of the transistor 314 within safe operating areas. For example, the voltage applied to the gate of the transistor 314 may be within an acceptable range for the gate-to-source voltage of the transistor 314.

Figure 4:
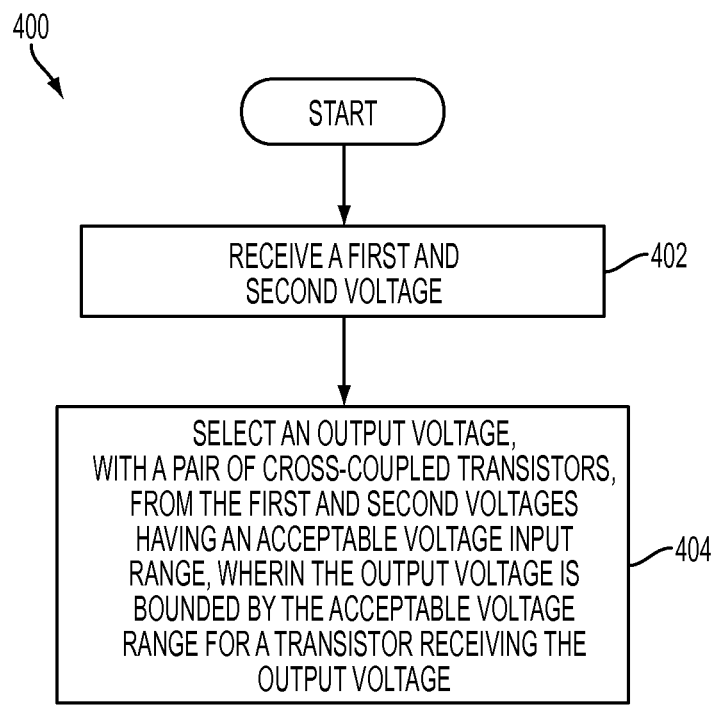
FIG. 4 is a method of operating a transistor with switching voltages higher than a nominal voltage of the transistor according to one embodiment of the disclosure.

In one embodiment, the voltage selectors of FIGS. 3A and 3B may be implemented through a cross-coupled pair of transistors. FIG. 4 is a method of operating a transistor device with switching voltages higher than a nominal voltage of the transistor according to one embodiment of the disclosure. A method 400 may begin at block 402 with receiving a first and a second voltage. In one embodiment of a voltage selector for a PMOS transistor, the first and second voltages may be the cascoded voltage, $V_{cas,p}$, and the output voltage, $V_{out}$. In another embodiment of the voltage selector for an NMOS transistor, the first and second voltages may be the cascoded voltage, $V_{cas,n}$, and the input voltage, Vin.

At block 404, an output voltage is selected from the first and second voltages through a pair of cross-coupled transistors. The cross-coupled pair of transistors may select a voltage that is acceptable for the safe operating ranges of the transistor coupled to the cross-coupled pair of transistors. For example, the output voltage selected may be bounded by the acceptable voltage range for the terminal of the transistor receiving the output voltage.

When the transistor coupled to the cross-coupled pair of transistors is a p-channel metal-oxide-semiconductor (PMOS) transistor, the cross-coupled pair of transistors may also be PMOS transistors. When the transistor coupled to the cross-coupled pair of transistors is an n-channel metal-oxide-semiconductor (NMOS) transistor, the cross-coupled pair of transistors may also be NMOS transistors.

Figure 5:
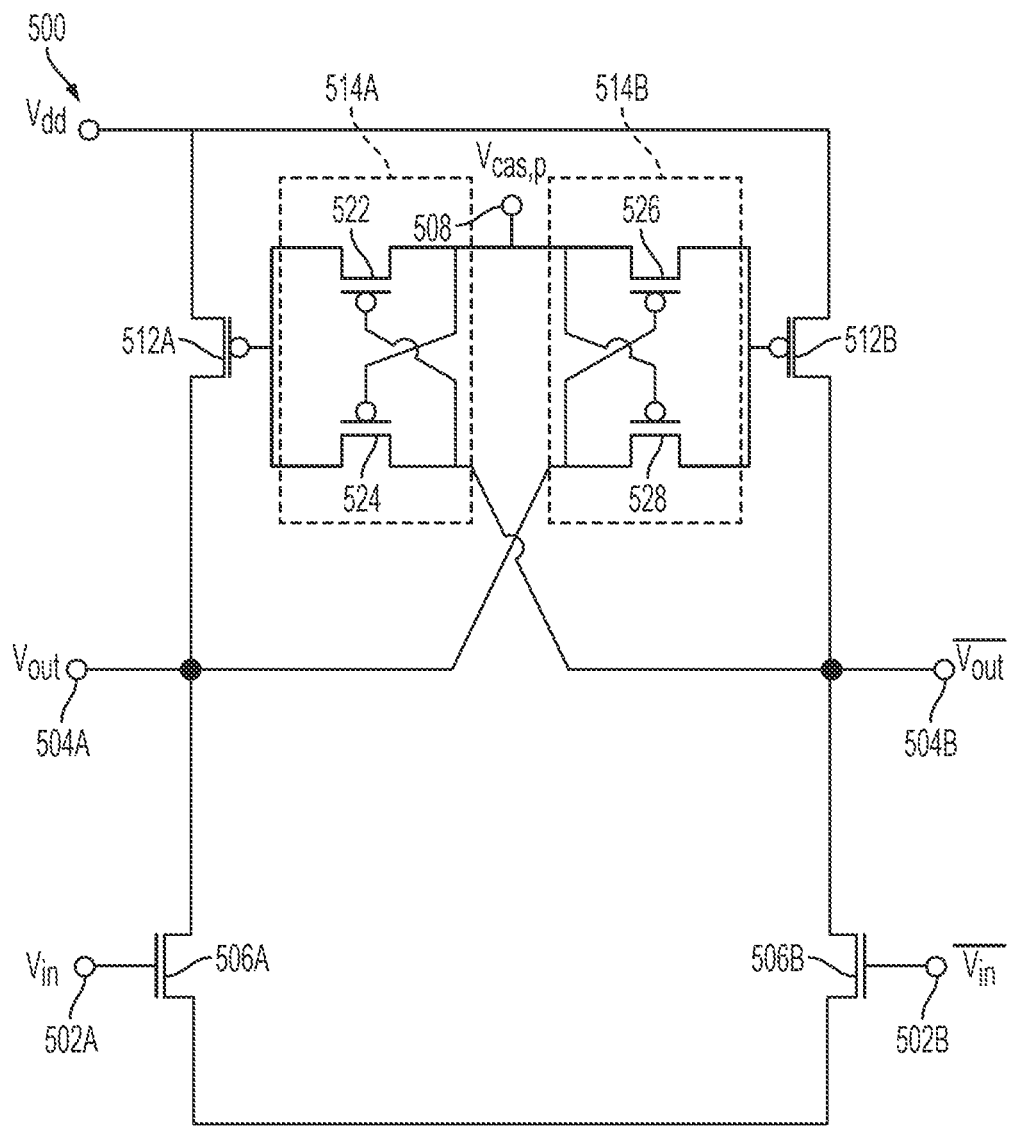
FIG. 5 is a circuit illustrating a level-shifter with p-channel metal-oxide-semiconductor (PMOS) transistors operating with switching voltages higher than a nominal voltage of the PMOS transistors according to one embodiment of the disclosure.

A voltage selector having a cross-coupled pair of transistors may be used to construct a level-shifter capable of operating supply voltages higher than the safe operating areas of the transistors used in the inverter. FIG. 5 is a circuit illustrating a level-shifter with p-channel metal-oxide-semiconductor (PMOS) transistors operating with switching voltages higher than a nominal voltage of the PMOS transistors according to one embodiment of the disclosure. A level-shifter 500 includes input nodes 502A and 502B for receiving differential input signal, $V_{in}$. The input nodes 502A and 502B may be coupled to n-channel metal-oxide-semiconductor (NMOS) transistors 506A and 506B, respectively. The level-shifter 500 may produce a differential output value, $V_{out}$, at output nodes 504A and 504B that is shifted from the input signal, $V_{in}$.

The inverter 500 may also include p-channel metal-oxide-semiconductor (PMOS) transistors 512A and 512B. Cross-coupled pairs of transistors 514A and 514B may be coupled to the gates of the PMOS transistors 512A and 512B. The cross-coupled pairs of transistors 514A and 514B may operate as voltage selectors to select an appropriate voltage for the PMOS transistors 512A and 512B, respectively. For example, the cross-coupled pairs of transistors 514A and 514B may select between the voltage output, $V_{out}$, of output nodes 504A and 504B and the cascoded voltage, $V_{cas,p}$, of input node 508. The selected voltage may be applied to the gates of the transistors 512A and 512B.

In the inverter 500, none of the transistors 512A, 512B, 522, 524, 526, or 528, receive a voltage differential across their terminals that exceeds the operational range for the transistors 512A, 512B, 522, 524, 526, or 528. For example, as will be shown in FIG. 6, when the output voltage, $V_{out}$, if applied to the gate of the PMOS transistor 512B would create a gate-to-source voltage, $V_{gs}$, exceeding the safe operational range of PMOS transistor 512B, then the cross-coupled pair of transistors may select the cascoded voltage, $V_{cas,p}$, to apply to the gate of the PMOS transistor 512B.

Figure 6:
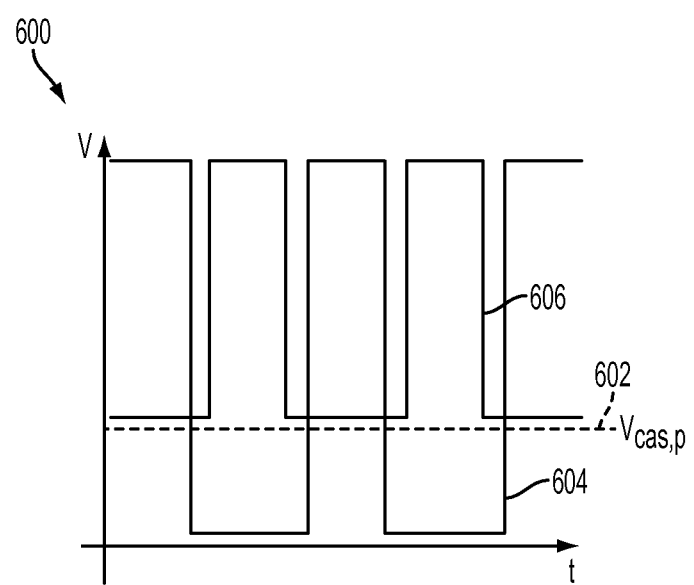
FIG. 6 is a graph illustrating voltages at certain nodes within the circuit of FIG. 5 according to one embodiment of the disclosure.

FIG. 6 is a graph illustrating voltages at certain nodes within the circuit of FIG. 5 according to one embodiment of the disclosure. A graph 600 includes a line 602 showing a cascoded voltage input to the input node 508, a line 604 showing an output voltage at the output node 504A, and a line 606 showing a gate voltage at the PMOS transistor 512B. As shown in FIG. 6, the line 606 corresponding to the input gate voltage does not fall below the cascoded voltage of line 602. Thus, even though the output voltage of line 604 swings through a larger range, the input to the PMOS transistor 512B is bounded to an acceptable voltage range by the cascoded voltage 602. The input to the PMOS transistor 512B of line 606 is bounded by the pair of transistors of 514A of FIG. 5, which select a maximum of either the output of line 604 and the cascoded voltage of line 602.

Figure 7:
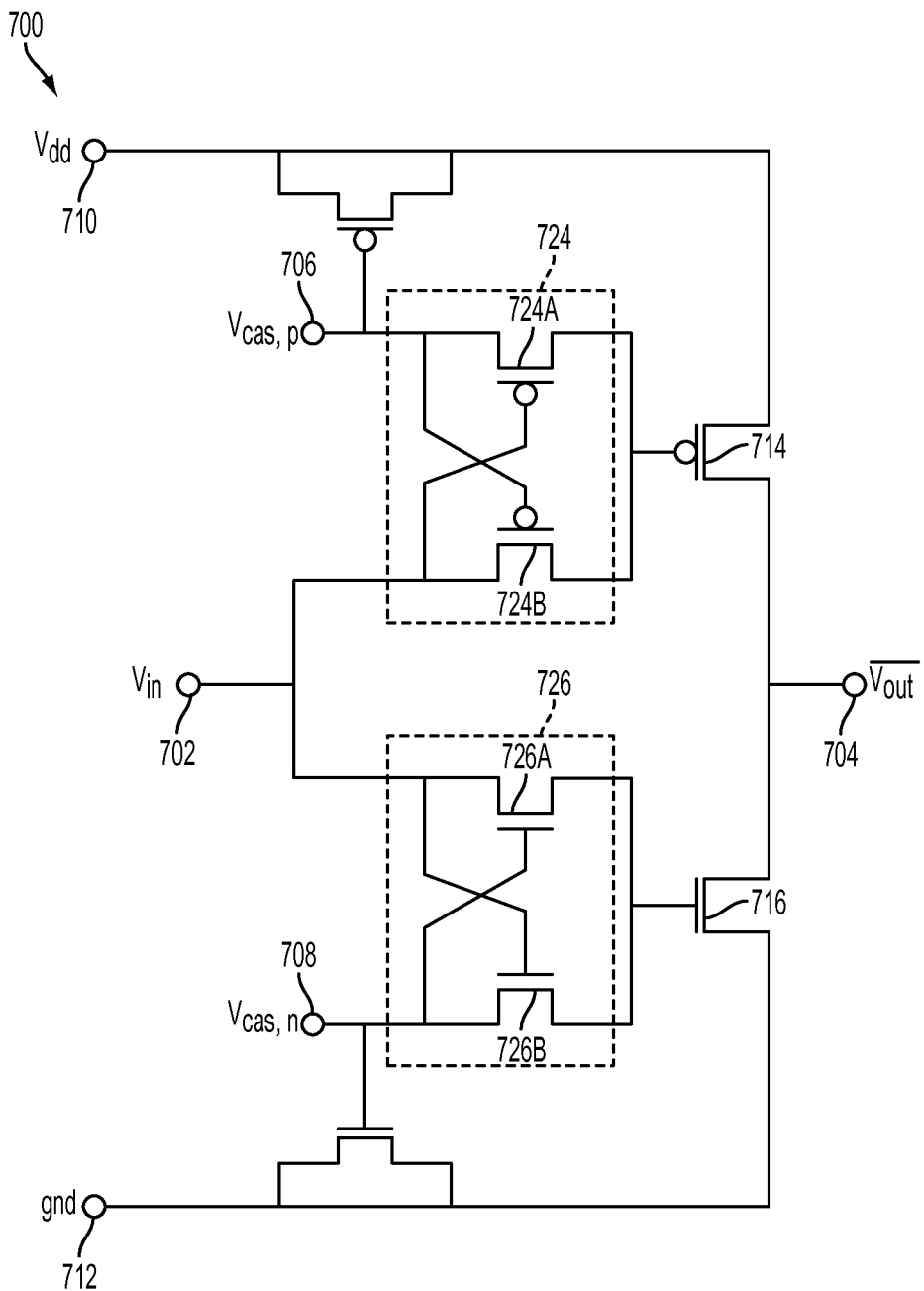
FIG. 7 is a circuit illustrating an inverter with p-channel metal-oxide semiconductor (PMOS) transistors and n-channel metal-oxide semiconductor (NMOS) transistors operating with switching voltages higher than a nominal voltage of the PMOS and NMOS transistors according to one embodiment of the disclosure.

FIG. 7 is a circuit illustrating an inverter with p-channel metal-oxide semiconductor (PMOS) transistors and n-channel metal-oxide semiconductor (NMOS) transistors operating with switching voltages higher than a nominal voltage of the PMOS and NMOS transistors according to one embodiment of the disclosure. An inverter 700 may include an NMOS transistor 716 and a PMOS transistor 714. The NMOS transistor 716 may be coupled to a cross-coupled pair of transistors 726, and the PMOS transistor 714 may be coupled to a cross-coupled pair of transistors 724. The cross-coupled pairs of transistors 724 and 726 act as voltage selectors for gate voltages of the PMOS transistor 714 and the NMOS transistor 716, respectively. Additionally, the transistors 714 and 716 may be coupled to a positive supply voltage, $V_{dd}$, received at input node 710 and a negative supply voltage, gnd, received at an input node 712, respectively.

The cross-coupled pair of transistors 724 may include, for example, PMOS transistors 724A and 724B. Input to the transistors 724A and 724B may include a cascoded voltage, $V_{cas,p}$, received from an input node 706 and an input voltage, $V_{in}$, at an input node 702. The cross-coupled pair of transistors 726 may include, for example, NMOS transistors 726A and 726B. Input to the transistors 726A and 726B may include a cascoded voltage, $V_{cas,n}$, received from an input node 708 and the input voltage, $V_{in}$, received from the input node 702. The output voltage, $V_{out}$, at output node 704 may be an inverted value of the input voltage, $V_{in}$, received at node 704.

Figure 8:
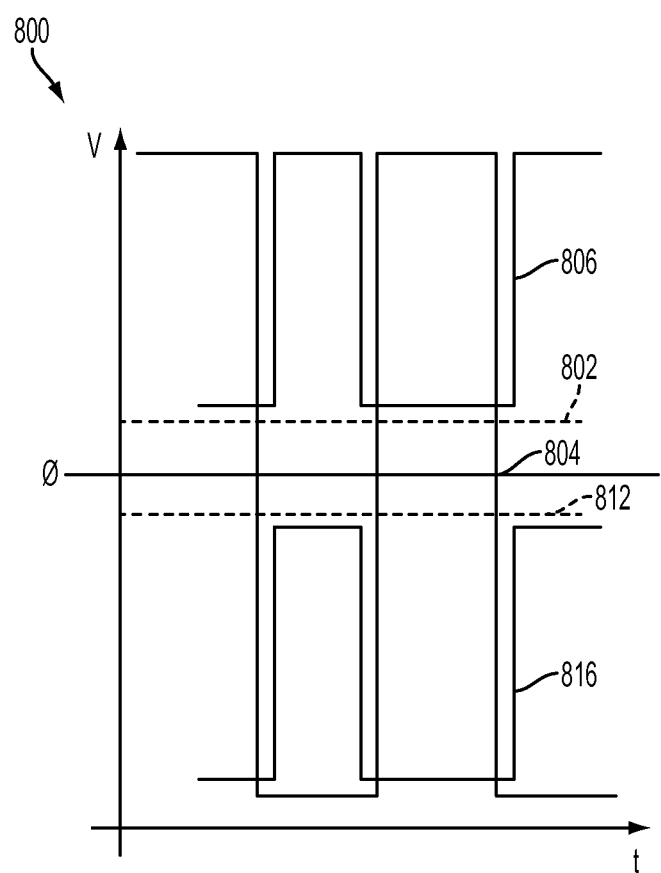
FIG. 8 is a graph illustrating voltages at certain nodes within the circuit of FIG. 7 according to one embodiment of the disclosure.

The cross-coupled pairs of transistors 724 and 726 may limit the voltage applied to the gates of PMOS transistor 714 and NMOS transistor 716, respectively, to an acceptable range. For example, the maximum gate-to-source voltage, $V_{gs}$, received at the PMOS transistor 714 may be equal to the supply voltage minus the cascoded voltage, $V_{cas,p}$. The graph of FIG. 8 illustrates the voltage selection operation. FIG. 8 is a graph illustrating voltages at certain nodes within the circuit of FIG. 7 according to one embodiment of the disclosure. A line 802 of graph 800 illustrates a cascoded voltage, $V_{cas,p}$, received at input node 706, and a line 812 illustrates a cascoded voltage, $V_{cas,n}$, received at input node 708. Line 804 illustrates a full swing input voltage, $V_{in}$, applied at node 702.

The line 806 shows an input to the gate of the PMOS transistor 714 selected by the cross-coupled pair of transistors 724. The line 806 is bounded within an acceptable range for the PMOS transistor 714 because the cross-coupled pair of transistors 724 selects a maximum voltage between the input voltage 804 and the cascoded voltage 802. Thus, when the input voltage 804 falls below the cascoded voltage 802, the cross-coupled pair of transistors limits the input to the gate of the PMOS transistor 714 from falling below the cascoded voltage 802. This keeps the gate-to-source voltage, $V_{gs}$, of the PMOS transistor 714 within an acceptable range, while the input is allowed to swing between positive and negative supply voltages.

The line 816 shows an input to the gate of the NMOS transistor 716 selected by the cross-coupled pair of transistors 726. The line 816 is bounded within an acceptable range for the NMOS transistor 716 because the cross-coupled pair of transistors 726 selects a minimum voltage between the input voltage 804 and the cascoded voltage 812. Thus, when the input voltage 804 increases above the cascoded voltage 812, the cross-coupled pair of transistors 726 limits the input to the gate of the NMOS transistor 716 from decreasing beyond the cascoded voltage 812. This keeps the gate-to-source voltage, $V_{gs}$, of the NMOS transistor 716 within an acceptable range, while the input is allowed to swing between positive and negative supply voltages.

Figure 9:
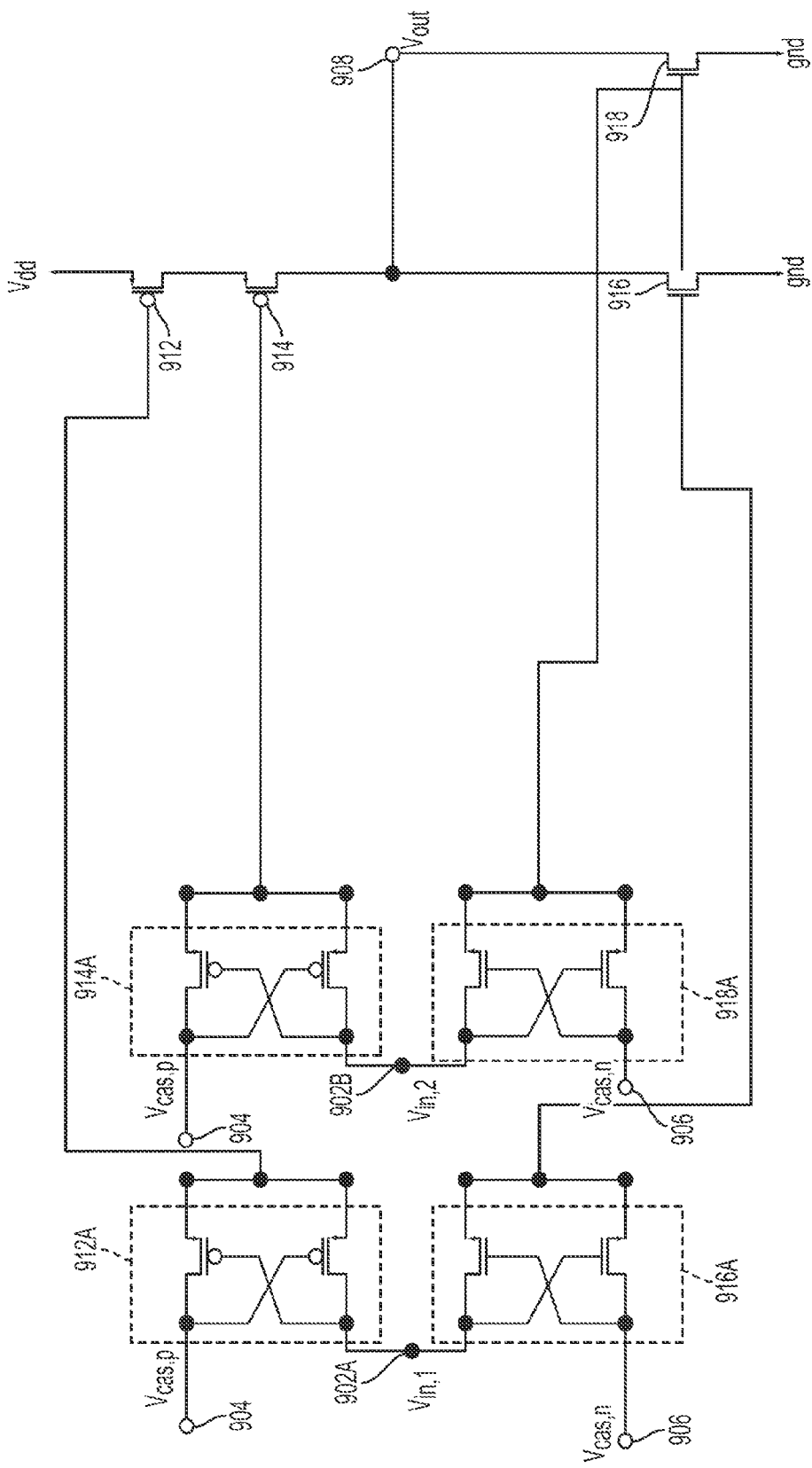
FIG. 9 is a circuit illustrating a NOR gate with p-channel metal-oxide semiconductor (PMOS) transistors and n-channel metal-oxide semiconductor (NMOS) transistors operating with switching voltages higher than a nominal voltage of the PMOS and NMOS transistors according to one embodiment of the disclosure.

Logic gates may also be constructed with transistors that have acceptable operating ranges less than the available power supply voltage. For example, a NOR gate may be constructed with such transistors coupled to voltage selecting cross-coupled pairs of transistors. FIG. 9 is a circuit illustrating a NOR gate with p-channel metal-oxide semiconductor (PMOS) transistors and n-channel metal-oxide semiconductor (NMOS) transistors operating with switching voltages higher than a nominal voltage of the PMOS and NMOS transistors according to one embodiment of the disclosure. A NOR gate 900 includes PMOS transistors 912 and 914 coupled at a drain of the PMOS transistor 912 and a source of the PMOS transistor 914. A gate of the PMOS transistor 912 may be coupled to a cross-coupled pair of transistors 912A for selecting a maximum voltage between an input voltage, $V_{in,1}$, received at input node 902A and a cascoded voltage, $V_{cas,p}$, received at input node 904. A gate of the PMOS transistor 914 is coupled to a cross-coupled pair of transistors 914A for selecting a maximum voltage between an input voltage, $V_{in,2}$, received at an input node 902B and the cascoded voltage, $V_{cas,p}$. The cross-coupled pair of transistors 912A and 914A may include a cross-coupled pair of PMOS transistors.

The NOR gate 900 may also include NMOS transistors 916 and 918 coupled at a drain of the NMOS transistor 916 and a drain of the NMOS transistor 918. A gate of the NMOS transistor 916 may be coupled to a cross-coupled pair of transistors 916A for selecting a minimum voltage between an input voltage, $V_{in,1}$, received at the input node 902, and a cascoded voltage, $V_{cas,n}$, received at an input node 906. A gate of the NMOS transistor 918 may be coupled to a cross-coupled pair of transistors 918A for selecting a minimum voltage between the input voltage, $V_{in,2}$, and the cascoded voltage, $V_{cas,n}$. The cross-coupled pair of transistors 916A and 918A may include a cross-coupled pair of NMOS transistors.

An output voltage, $V_{out}$, at output node 908 may be the result of a NOR operation performed on the received input voltages, $V_{in,1}$ and $V_{in,2}$. For example, when the $V_{in,1}$ voltage is a high logic value and the $V_{in,2}$ voltage is a low logic value, the output voltage, $V_{out}$, may be a low logic value. Although only a two-input NOR gate 900 is shown in FIG. 9, additional inputs may be added to the NOR gate 900. The NOR gate 900 may allow operation with transistors 912, 914, 916, and/or 918 that have acceptable input ranges smaller than a full swing of the input voltages, $V_{in,1}$ and $V_{in,2}$.

Figure 10:
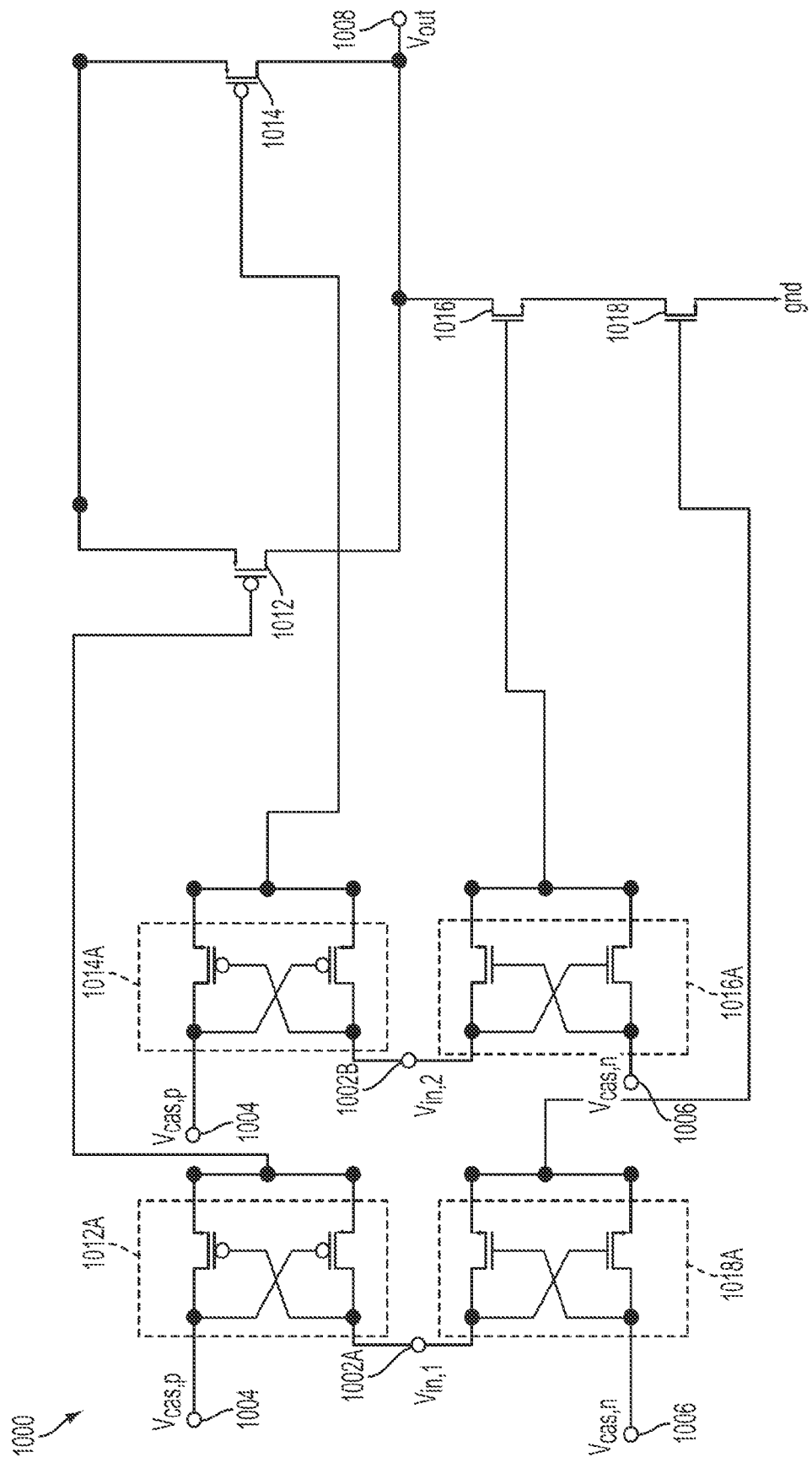
FIG. 10 is a circuit illustrating a NAND gate with p-channel metal-oxide semiconductor (PMOS) transistors and n-channel metal-oxide semiconductor (NMOS) transistors operating with switching voltages higher than a nominal voltage of the PMOS and NMOS transistors according to one embodiment of the disclosure.

Similar to the logic gate constructed for the NOR gate shown in FIG. 9, a NAND gate may be constructed with cross-coupled pairs of transistors to allow full swing operation when full swing is outside the safe operating range of the transistors. FIG. 10 is a circuit illustrating a NAND gate with p-channel metal-oxide semiconductor (PMOS) transistors and n-channel metal-oxide semiconductor (NMOS) transistors operating with switching voltages higher than a nominal voltage of the PMOS and NMOS transistors according to one embodiment of the disclosure. A NAND gate 1000 may include PMOS transistors 1012 and 1014 coupled at a source of the PMOS transistor 1012 and a source of the PMOS transistor 1014. A gate of the PMOS transistor 1012 may be coupled to a cross-coupled pair of transistors 1012A for selecting a maximum voltage between a cascoded voltage, $V_{cas,p}$, received at an input node 1004, and an input voltage, $V_{in,1}$, received at an input node 1002A. A gate of the PMOS transistor 1014 may be coupled to a cross-coupled pair of transistors 1014A for selecting a maximum voltage between the cascoded voltage, $V_{cas,p}$, and an input voltage, $V_{in,2}$, received at an input node 1002B.

The NAND gate 1000 may also include NMOS transistors 1016 and 1018 coupled at a source of NMOS transistor 1016 and a drain of NMOS transistor 1018. A drain of the NMOS transistor 1016 may also be coupled to the drains of the PMOS transistors 1012 and 1014. A gate of the NMOS transistor 1018 may be coupled to a cross-coupled pair of transistors 1018A for selecting a minimum voltage between a cascoded voltage, $V_{cas,n}$, received at an input node 1006, and the input voltage, $V_{in,1}$. A gate of the NMOS transistor 1016 may be coupled to a cross-coupled pair of transistors 1016A for selecting a minimum voltage between a cascoded voltage, $V_{cas,n}$, and the input voltage, $V_{in,2}$.

An output voltage, $V_{out}$, at an output node 1008 may be a result of a NAND operation on the inputs $V_{in,1}$ and $V_{in,2}$ received at input nodes 1002A and 1002B. For example, when $V_{in,1}$ is a high logic value and $V_{in,2}$ is a low logic value, then the output voltage $V_{out}$ may be a high logic value. Although only a two-input NAND gate 1000 is shown in FIG. 10, additional inputs may be added to the NAND gate 1000. The NAND gate 1000 may allow operation with transistors 1012, 1014, 1016, and/or 1018 that have acceptable input ranges smaller than a full swing of the input voltages, $V_{in,1}$ and $V_{in,2}$.

The circuits and methods described above allow the operation of various circuits with transistors having an acceptable operating range smaller than a power supply voltage or a full swing from negative to positive supply voltages. For example, circuits, such as inverters, level shifters, and logic gates including NOR and NAND gates, may be constructed with 5 Volt LDMOS transistors with an operating range for gate-to-source voltage, $V_{gs}$, of 3.6 Volts that operate with a power supply of 5 Volts. In particular, cross-coupled pairs of transistors may be used as voltage selectors to ensure the gate-to-source voltage, $V_{gs}$, of transistors in the circuits do not exceed a max $V_{gs}$ by selecting a minimum and/or maximum voltage between a first voltage and a cascoded voltage. Additionally, low voltage operation, such as with supply voltages below 1.0 Volt, are possible with the use of voltage selectors, including the cross-coupled pair of transistors described above.

If implemented in firmware and/or software, the operations described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A level shifter, comprising:
   a first PMOS transistor having a drain coupled to a first NMOS transistor;
   a second PMOS transistor having a drain coupled to a second NMOS transistor;
   a first input node coupled to the first NMOS transistor;
   a second input node coupled to the second NMOS transistor;
   a first cross-coupled pair of transistors coupled to the first PMOS transistor,
      wherein the first cross-coupled pair of transistors is configured to receive a first voltage and a second voltage and to output a first gate voltage to the first PMOS transistor, and
      wherein the first gate voltage is bounded to an acceptable voltage level for the first PMOS transistor allowing at least one of the first voltage and the second voltage to swing with an amplitude greater than the acceptable voltage level for the first PMOS transistor; and
   a second cross-coupled pair of transistors coupled to the second PMOS transistor,
      wherein the second cross-coupled pair of transistors is configured to receive the first voltage and a third voltage and to output a second gate voltage to the second PMOS transistor, and
      wherein the second gate voltage is bounded to an acceptable voltage level for the second PMOS transistor allowing at least one of the first voltage and the third voltage to swing with an amplitude greater than the acceptable voltage level for the second PMOS transistor.

2. The level shifter of claim 1, further comprising a power supply coupled to the first cross-coupled pair of transistors to provide a supply voltage, wherein the power supply voltage is higher than the maximum gate-to-source voltage of the first PMOS transistor.

3. The level shifter of claim 1, wherein the first cross-coupled pair of transistors comprises a cross-coupled pair of PMOS transistors.

4. The level shifter of claim 3, wherein the cross-coupled pair of PMOS transistors are configured to act as a maximum voltage selector between a cascoded voltage and a full swing input such that a maximum gate-to-source voltage of the PMOS transistor is approximately a supply voltage minus the cascoded voltage.

5. The level shifter of claim 1, wherein the level shifter further comprises:
   a first output node coupled to the second set of cross-coupled transistors;
   a second output node coupled to the first set of cross-coupled transistors
   wherein a signal at the first output node and the second output node are a level shifted version of an input signal received at the first input node and the second input node.

6. A NOR gate, comprising:
   a first input node configured to receive a first voltage;
   a second input node configure to receive a second voltage;
   a third input node configured to receive a third voltage;
   a fourth input node configured to receive a fourth voltage;
   a first PMOS transistor comprising a first PMOS gate and a first PMOS drain;
   a first cross-coupled pair of PMOS transistors coupled to the first input node and to the second input node,
      wherein the first cross-coupled pair of PMOS transistors is configured to receive the first voltage and the second voltage and to output a first PMOS gate voltage to the first PMOS transistor, and
      wherein the first PMOS gate voltage is bounded to an acceptable voltage level for the first PMOS transistor allowing at least one of the first voltage and the second voltage to swing with an amplitude greater than the acceptable voltage level for the first PMOS transistor;
   a second PMOS transistor comprising a second PMOS gate and a second PMOS source, wherein the second PMOS source is coupled to the first PMOS drain of the first PMOS transistor;
   a second pair of cross-coupled PMOS transistors, wherein the second cross-coupled pair of PMOS transistors is configured to receive the first voltage and the third voltage and output a second PMOS gate voltage to the second PMOS gate, and wherein the second PMOS gate voltage is bounded to an acceptable voltage level for the second PMOS transistor allowing at least one of the first voltage and the third voltage to swing with an amplitude greater than the acceptable voltage level for the second PMOS transistor;
   a first NMOS transistor comprising a first NMOS gate and a first NMOS drain, wherein the first NMOS drain is coupled to a second PMOS drain of the second PMOS transistor;
   a first pair of cross-coupled NMOS transistors, wherein the first cross-coupled pair of NMOS transistors is configured to receive the second voltage and the fourth voltage and to output a first NMOS gate voltage to the first NMOS gate of the first NMOS transistor;
   a second NMOS transistor comprising a second NMOS gate and a second NMOS drain, wherein the second NMOS drain is coupled to the first NMOS drain; and
   a second pair of cross-coupled NMOS transistors, wherein the second cross-coupled pair of NMOS transistors is configured to receive the third voltage and the fourth voltage and to output a second NMOS gate voltage to the second NMOS gate of the second NMOS transistor.

7. The NOR gate of claim 6, further comprising a logic output node coupled to a drain of the second NMOS transistor, wherein an output signal at the logic output node is a result of a NOR operation on the second voltage at the second input node and the third voltage at the third input node.

8. A NAND gate, comprising:
   a first input node coupled to a first voltage;
   a second input node coupled to a second voltage;
   a third input node coupled to a third voltage;
   a fourth input node coupled to a fourth voltage;
   a first PMOS transistor comprising a first PMOS gate;
   a first cross-coupled pair of PMOS transistors coupled to the first input node and the second input node and coupled to the first PMOS gate,
      wherein the cross-coupled pair of PMOS transistors is configured to receive the first voltage and the second voltage and to output a first PMOS gate voltage to the first PMOS gate, and
      wherein the first PMOS gate voltage is bounded to an acceptable voltage level for the first PMOS transistor allowing at least one of the first voltage and the second voltage to swing with an amplitude greater than the acceptable voltage level for the transistor;

a second PMOS transistor comprising a second PMOS gate and a second PMOS drain, wherein the second PMOS drain is coupled to a first PMOS drain of the first PMOS transistor;

a second pair of cross-coupled PMOS transistors, wherein the second cross-coupled pair of PMOS transistors is configured to receive the first voltage and the third voltage and output a second PMOS gate voltage to the second PMOS transistor, and wherein the second PMOS gate voltage is bounded to an acceptable voltage level for the second PMOS transistor allowing at least one of the first voltage and the third voltage to swing with an amplitude greater than the acceptable voltage level for the second PMOS transistor;

a first NMOS transistor comprising a first NMOS gate and a first NMOS drain, wherein the first NMOS drain is coupled to a second PMOS drain of the second PMOS transistor;

a first pair of cross-coupled NMOS transistors, wherein the first cross-coupled pair of NMOS transistors is configured to receive the third voltage and the fourth voltage and to output a first NMOS gate voltage to the first NMOS gate of the first NMOS transistor, and wherein the first NMOS gate voltage is bounded to an acceptable voltage level for the first NMOS transistor allowing at least one of the third voltage and the fourth voltage to swing with an amplitude greater than the acceptable voltage level for the first NMOS transistor;

a second NMOS transistor comprising a second NMOS gate and a second NMOS drain, wherein the second NMOS drain is coupled to a first NMOS source of the first NMOS transistor; and a second pair of cross-coupled NMOS transistors, wherein the second cross-coupled pair of NMOS transistors is configured to receive the second voltage and the fourth voltage and to output a second NMOS gate voltage to the second NMOS gate of the second NMOS transistor, and wherein the second NMOS gate voltage is bounded to an acceptable voltage level for the second NMOS transistor allowing at least one of the second voltage and the fourth voltage to swing with an amplitude greater than the acceptable voltage level for the second NMOS transistor.

9. The apparatus of claim 8, wherein the first pair of cross-coupled NMOS transistors selects a minimum voltage between a second cascoded voltage and a full swing input such that a maximum gate-to-source voltage of the first NMOS transistor is approximately the second cascoded voltage when the input is high and low otherwise.

10. The NAND gate of claim 8, wherein the first cross-coupled pair of PMOS transistors are configured to act as a maximum voltage selector between a cascoded voltage and a full swing input such that a maximum gate-to-source voltage of the first PMOS transistor is approximately a supply voltage minus the cascoded voltage.

11. The NAND gate of claim 8, further comprising a logic output node coupled to a source of the second PMOS transistor and to a source of the second NMOS transistor, wherein an output signal at the output node is a result of an AND operation on the second voltage at the second input node and the third voltage at the third input node.

12. A method, comprising:
receiving a logic value representing a binary value as an input signal at a logic input node;
receiving a first voltage at a first input node;
receiving a second voltage at a second input node;
inverting, with complementary metal-oxide-semiconductor (CMOS) logic circuit, the logic value, wherein the step of inverting comprises:
generating a first gate voltage, with a first cross-coupled pair of transistors, from the first voltage and the input signal for a PMOS transistor of the CMOS logic circuit having an acceptable voltage input range smaller than at least one of the first voltage and the input signal, wherein the first gate voltage is bounded by an acceptable voltage range for the PMOS transistor allowing at least one of the first voltage and the input signal to swing with an amplitude greater than the acceptable voltage level for the PMOS transistor; and
generating a second gate voltage, with a second cross-coupled pair of transistors from the second voltage and the input signal for a NMOS transistor of the CMOS logic circuit having an acceptable voltage input range smaller than at least one of the second voltage and the input signal, wherein the second gate voltage is bounded by an acceptable voltage range for the NMOS transistor allowing at least one of the second voltage and the input signal to swing with an amplitude greater than the acceptable voltage level for the NMOS transistor.

13. The method of claim 12, wherein the acceptable voltage range for at least one of the NMOS transistor and PMOS transistor is bounded by a maximum gate-to-source voltage for the transistor.

14. The method of claim 13, wherein a reference voltage for the acceptable voltage range is ground for the NMOS transistor and a reference voltage for the acceptable voltage range is a power supply voltage for the PMOS transistor.

15. The method of claim 13, wherein the step of generating the first gate voltage comprises generating an output voltage for the PMOS transistor, wherein the first cross-coupled pair of transistors are configured to act as a maximum voltage selector between a cascoded voltage and at least one of a full swing input, such that a maximum gate-to-source voltage of the PMOS transistor is approximately a supply voltage minus the cascoded voltage.

16. The method of claim 13, wherein the step of generating the output voltage comprises generating an output voltage for the NMOS transistor, wherein the second cross-coupled pair of transistors are configured to act as a minimum voltage selector between a second cascoded voltage and a full swing input, such that a maximum gate-to-source voltage of the NMOS transistor is approximately the second cascoded voltage.

17. The method of claim 13, further comprising performing logic operations on the inverted logic value.

18. An inverter, comprising:
a PMOS transistor comprising having a gate, a drain, and a source, wherein the source is coupled to a first supply voltage;
an NMOS transistor comprising a gate, a drain, and a source, wherein the drain is coupled to the drain of the PMOS transistor, and wherein the source is coupled to a second supply voltage;
a first level shifter coupled to the gate of the PMOS transistor, the first level shifter comprising a pair of cross-coupled PMOS transistors configured to select a maximum voltage between a cascoded voltage and a full swing input such that a maximum gate-to-source voltage of the PMOS transistor is approximately the supply voltage minus the cascoded voltage; and
a second level shifter coupled to the gate of the NMOS transistor, the second level shifter comprising a pair of cross-coupled NMOS transistors configured to select a minimum between a second cascoded voltage and the full swing input such that a maximum gate-to-source voltage of the NMOS transistor is approximately the second cascoded voltage.

19. The inverter of claim 18, wherein the first cascoded voltage is approximately less than one half of the first supply voltage, and wherein the second cascoded voltage is approximately more than one half of the first supply voltage.

20. The inverter of claim 19, wherein the first cascoded voltage is approximately three tenths of the first supply voltage, and wherein the second cascoded voltage is approximately seven tenths of the first supply voltage.

21. The inverter of claim 18, wherein the first supply voltage is a battery voltage of a mobile device, and wherein the inverter is configured to operate across a range of battery voltages.

\* \* \* \* \*